US006577161B2

(12) United States Patent
Sun et al.

(10) Patent No.: US 6,577,161 B2
(45) Date of Patent: Jun. 10, 2003

(54) ONE CELL PROGRAMMABLE SWITCH USING NON-VOLATILE CELL WITH UNIDIRECTIONAL AND BIDIRECTIONAL STATES

(75) Inventors: Albert Sun, Taipei (TW); Eric Sheu, Hsinchu (TW); Ying-Che Lo, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/873,153

(22) Filed: Jun. 1, 2001

(65) Prior Publication Data

US 2002/0190750 A1 Dec. 19, 2002

(51) Int. Cl.[7] .................. H03K 19/177; G11C 16/04
(52) U.S. Cl. ...................... 326/49; 326/38; 326/39; 326/40; 326/41; 365/185.01; 365/185.03; 365/189.05; 327/434
(58) Field of Search .................. 365/185.01, 185.03, 365/189.05; 326/38–41; 327/434

(56) References Cited

U.S. PATENT DOCUMENTS

| | | | |
|---|---|---|---|
| 4,870,470 A | 9/1989 | Bass, Jr. et al. | ........... 357/23.5 |
| 4,871,930 A | 10/1989 | Wong et al. | ................. 307/465 |
| 4,879,688 A | 11/1989 | Turner et al. | |

(List continued on next page.)

OTHER PUBLICATIONS

John Villasenor et al. *"Configurable Computing"* Scientific American Configurable Computing Jun. 1997 pp. 1–10.
*"IBM to Fab Xilinx Ics, Moves Copper 0.13–/0.10–micron Processes to Foundry Services"* Semiconductor Business News—Silicon Strategies consisting of two pages dated Mar. 4, 2002.

(List continued on next page.)

*Primary Examiner*—Michael Tokar
*Assistant Examiner*—Vibol Tan
(74) *Attorney, Agent, or Firm*—Mark A. Haynes; Haynes Beffel & Wolfeld LLP

(57) ABSTRACT

A one transistor, non-volatile programmable switch includes uni-directional and in some embodiments, bi-directional, states. The programmable switch is used in an integrated circuit, and comprises a first node and a second node coupled with corresponding circuit elements in the integrated circuit. A non-volatile programmable transistor having a drain coupled to one of the first node and second node, a source coupled to the other of the first node and second node, gate coupled to an energizing conductor, and a data storage structure constitute the programmable switch. The non-volatile programmable transistor used in the switch is a charge programmable device (e.g. SONOS cell), in which the data storage structure comprises a nitride layer, or other charge trapping layer, between oxides or other insulators. The transistor stores four states, including a first unidirectional state in which the cell allows signal flow in a first direction, as second unidirectional state in which the cell allows signal flow in a second direction, opposite to the first direction, a third state in which the cell allows bi-directional signal flow, and a fourth state in which signal flow is blocked (the switch is open). A charge pump is coupled to the energizing conductor to produce a boosted voltage during logical operation of integrated circuit, so that voltage dissipation across the programmable switch is minimized or eliminated. In an embodiment, in which a charge programmable device is used, programmable circuitry is coupled to the first and second nodes, and to the energizing conductor to apply voltages sufficient to inject and remove charge from the charge storage structure for programming the charge programmable device. For integrated circuits in which voltages used for programming and erasing the non-volatile charge programmable device are high relative to the design rule for the circuit elements to be interconnected, a structure to withstand the high voltages is included.

48 Claims, 6 Drawing Sheets

U.S. PATENT DOCUMENTS

| | | | |
|---|---|---|---|
| 5,015,885 A | * 5/1991 | El Gamal et al. | 307/465 |
| 5,028,810 A | 7/1991 | Castro et al. | 307/201 |
| 5,042,004 A | 8/1991 | Agrawal et al. | 364/900 |
| 5,117,389 A | 5/1992 | Yiu | 365/104 |
| 5,227,335 A | 7/1993 | Holschwandner et al. | 437/192 |
| 5,247,478 A | 9/1993 | Gupta et al. | 365/185 |
| 5,251,169 A | 10/1993 | Josephson | 365/72 |
| 5,260,610 A | 11/1993 | Pedersen et al. | 307/465 |
| 5,317,534 A | 5/1994 | Choi et al. | 365/182 |
| 5,341,337 A | 8/1994 | Hotta | 365/204 |
| 5,392,233 A | 2/1995 | Iwase | 365/104 |
| 5,559,733 A | 9/1996 | McMillan et al. | 365/145 |
| 5,625,586 A | 4/1997 | Yamasaki et al. | 365/104 |
| 5,731,608 A | 3/1998 | Hsu et al. | 257/295 |
| 5,739,569 A | * 4/1998 | Chen | 257/321 |
| 5,761,120 A | * 6/1998 | Peng et al. | 365/185.14 |
| 5,764,096 A | 6/1998 | Lipp et al. | 327/434 |
| 5,768,192 A | 6/1998 | Eitan | 365/185.24 |
| 5,821,581 A | * 10/1998 | Kaya et al. | 257/321 |
| 5,901,330 A | 5/1999 | Sun et al. | 395/828 |
| 5,905,674 A | 5/1999 | Choi | 365/185.1 |
| 5,943,259 A | 8/1999 | Choi | 365/185.03 |
| 5,944,593 A | 8/1999 | Chiu et al. | 451/442 |
| 5,949,710 A | 9/1999 | Pass et al. | 365/185.05 |
| 5,995,744 A | 11/1999 | Guccione | 395/500 |
| 6,011,725 A | 1/2000 | Eitan | 365/185.33 |
| 6,023,102 A | 2/2000 | Nguyen et al. | 257/774 |
| 6,028,445 A | 2/2000 | Lawman | 326/38 |
| 6,049,222 A | 4/2000 | Lawman | 326/38 |
| 6,094,065 A | 7/2000 | Tavana et al. | 326/39 |
| 6,102,963 A | 8/2000 | Agrawal | 716/17 |
| 6,105,105 A | 8/2000 | Trimberger | 711/103 |
| 6,122,209 A | 9/2000 | Pass et al. | 365/201 |
| 6,181,597 B1 | 1/2001 | Nachumovsky | 365/185.03 |
| 6,272,655 B1 | * 8/2001 | Hecht et al. | 714/725 |
| 6,295,230 B1 | 9/2001 | Madurawe et al. | |
| 6,323,671 B1 | 11/2001 | Ra | 324/765 |
| 6,331,463 B1 | 12/2001 | Chen | 438/257 |

OTHER PUBLICATIONS

"*IBM, Xilinx to Put PowerPC Core In FPGAs; Foundry Deal Includes Copper Processes*" Semiconductor Business News—Silicon Strategies consisting of two pages dated Jul. 25, 2000.

* cited by examiner

ONE CELL PROGRAMMABLE SWITCH USING NON-VOLATILE CELL WITH UNIDIRECTIONAL AND BIDIRECTIONAL STATES

RELATED APPLICATION DATA

The present application is related to our co-pending U.S. patent application Ser. No. 09/872,716 entitled ONE CELL PROGRAMMABLE SWITCH USING NON-VOLATILE CELL, filed on the same day as the present application, and naming the same inventors; and to our co-pending U.S. patent application Ser. No. 09/872,497 entitled FOUR STATE PROGRAMMABLE INTERCONNECT DEVICE FOR BUS LINE AND I/O PAD, filed on the same day as the present application

BACKGROUND OF THE INVENTION

1. Field of the Invention

The present invention is related to programmable switches for integrated circuits, such as configurable system-on-chip circuits, field programmable gate arrays and other devices using programmable switches for interconnecting circuit elements.

2. Description of Related Art

Programmable switches are used in a wide variety circuit devices in order to increase the flexibility of designs. For example, a field programmable gate array includes an array of logic elements and wiring interconnections with thousands of programmable interconnects which are implemented using switches that are programmable in the field. Each programmable switch can connect or disconnect circuit elements, such as nodes in two logic circuits and such as wiring interconnections between modules in the circuit.

In addition to field programmable gate array devices, programmable switches and other programmable logic are being applied for so-called system-on-chip designs, which typically include a processor module, a non-volatile memory module, and a programmable logic module among other components. The programmable switches may be used for interconnect structures inside such circuit modules, or between such circuit modules.

It has been proposed to use charge programmable non-volatile memory elements for programmable switches. See U.S. Pat. No. 5,247,478, U.S. Pat. No. 5,764,096 and U.S. Pat. No. 6,122,209. In these patents, floating gate memory cells are used in combination with complex circuitry for programming and erasing such cells. The source and drain of the floating gate memory cell in such switches are coupled to the nodes to be connected or disconnected. The floating gate which controls the operation of the switch is then coupled to independent lines that are used for injecting for removing charge to set the state of the switch. These prior art approaches are relatively large and complex for use as programmable switches in high density integrated circuit environments.

As the uses of programmable switches are expanding, and the density and complexity of the integrated circuits using such switches increases, it is important that the area and the complexity of such switches is reduced. Furthermore, it is desirable that such switches are able to interconnect the circuit elements without significant degradation in voltage across the switch.

SUMMARY OF THE INVENTION

The present invention provides a one transistor, non-volatile programmable switch which is less complex and requires less area than prior art devices, and includes at least one state for uni-directional signal flow. In some embodiments, the switch also has a programmable bi-directional state. The programmable switch according to the present invention is used in an integrated circuit, and comprises a first node and a second node coupled with corresponding circuit elements in the integrated circuit. A non-volatile programmable transistor having a drain coupled to one of the first node and second node, a source coupled to the other of the first node and second node, gate coupled to an energizing conductor, and a data storage structure constitute the programmable switch.

In one embodiment, the non-volatile programmable transistor used in the switch is a charge programmable device (e.g. SONOS cell, see U.S. Pat. No. 6,011,725 for a description of such SONOS cells), in which the data storage structure comprises a nitride layer, or other charge trapping layer, between oxides or other insulators. The transistor stores up to four states, including a first unidirectional state in which the cell allows signal flow in a first direction, as second unidirectional state in which the cell allows signal flow in a second direction, opposite to the first direction, a third state in which the cell allows bi-directional signal flow, and a fourth state in which signal flow is blocked (the switch is open).

In one embodiment, a charge pump is coupled to the energizing conductor to produce a boosted voltage during logical operation of integrated circuit. The boosted voltage in one preferred embodiment comprises a voltage greater than the power potential on said circuit elements by at least a threshold voltage of the programmable transistor, so that voltage dissipation across the programmable switch is minimized or eliminated.

In yet another embodiment, in which the non-volatile programmable transistor is a charge programmable device, programmable circuitry is coupled to the first and second nodes, and to the energizing conductor to apply voltages sufficient to inject and remove charge from the charge storage structure for programming the charge programmable device. The programming circuitry comprises in various embodiments resources inducing Fowler-Nordheim tunneling to remove charge from the charge storage element, and resources inducing Fowler-Nordheim tunneling to inject charge into the charge storage element.

For integrated circuits in which voltages used for programming and erasing the non-volatile charge programmable device are high relative to the design rule for the circuit elements to be interconnected, a structure coupled with the circuit elements to withstand the high voltages is included. In one embodiment, the circuit element coupled with the first node comprises a transistor, and the structure to withstand the high voltages applied by the programming circuitry comprises a gate insulator adapted to withstand the voltages. In one embodiment, the gate insulator comprises essentially silicon dioxide having a thickness sufficient to withstand the voltages.

In one embodiment, the programming circuitry includes logic to disconnect power from at least one of the circuit element coupled to the first node and the circuit element coupled to the second node while applying energy to inject or remove charged from the charge storage element. Another embodiment, the programming circuitry includes a first voltage conductor coupled to the first node, a second voltage conductor to the second node, and logic to disconnect the first and second voltage conductors from the first and second nodes during logical operation of the integrated circuit.

According to yet other embodiments, the present invention comprises an integrated circuit that includes an array of non-volatile charge programmable memory cells and configurable logic in communication with such array. A plurality of programmable switches is included on integrated circuit for support of the configurable logic as described above. In one embodiment, the programmable switches consist of non-volatile charge programmable devices which have essentially the same cell structure as the non-volatile charge programmable memory cells in the array.

Other aspects and advantages of the present invention can be seen upon review of the figures, the detailed description and the claims which follow.

DETAILED DESCRIPTION

Figure 1:
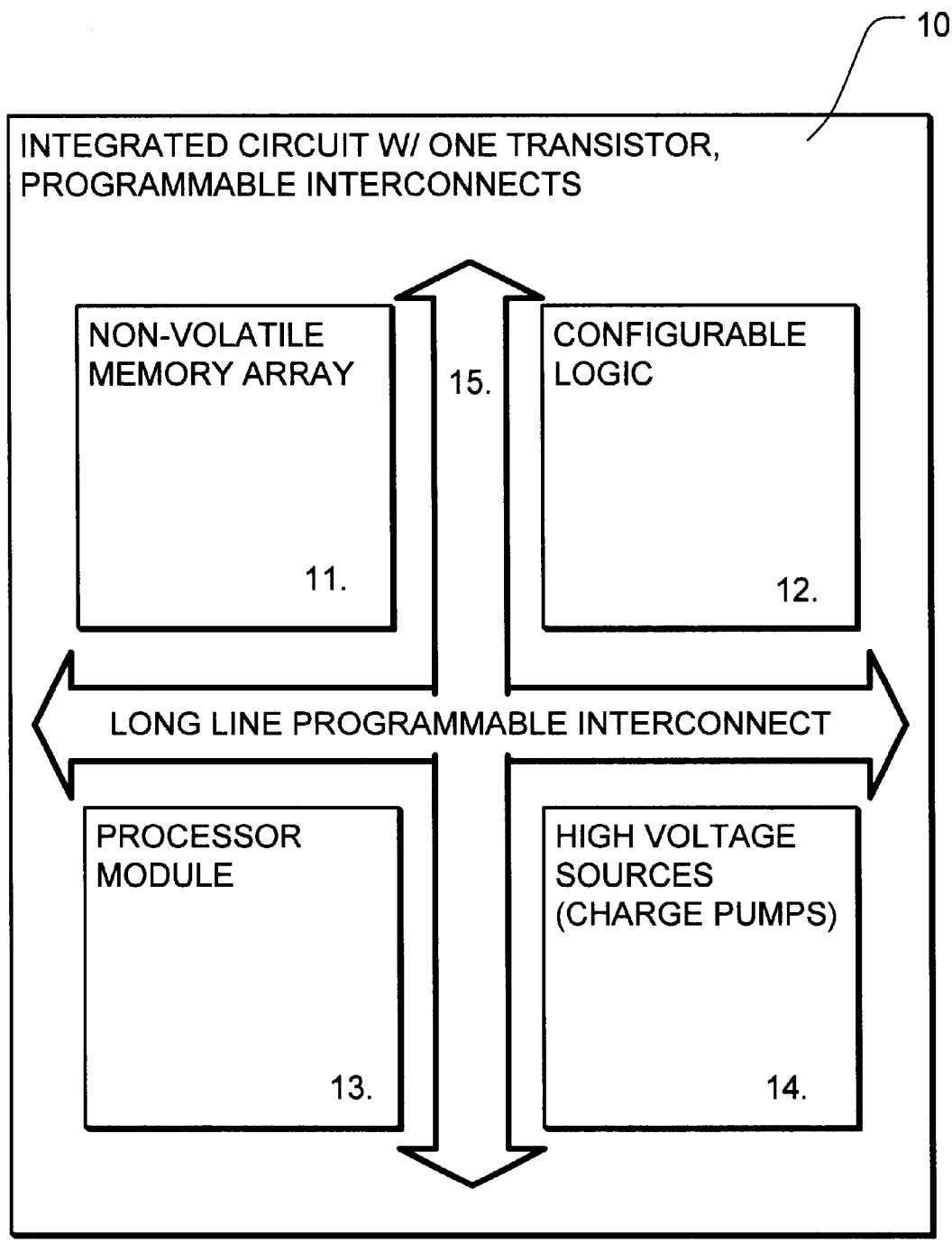
FIG. 1 is a simplified diagram of an integrated circuit with one transistor, programmable interconnects according to the present invention.

A detailed description of embodiments of the present invention is provided with reference to FIGS. 1–8, in which FIG. 1 shows an example system-on-chip integrated circuit 10 including one transistor programmable switches according to the present invention.

The integrated circuit 10 includes a plurality of circuit modules 11, 12, 13 and 14 and a long line programmable interconnect structure 15 used for configuring interconnection of the modules. In this example, the module 11 comprises a non-volatile memory array, such as a flash memory array based upon oxide nitride oxide memory transistors in one embodiment. Alternative integrated circuits include memory arrays based upon mask programmable ROM cells, floating gate memory cells, dynamic RAM cells, static RAM cells, or other memory architectures.

The conventional interconnection devices are bi-directional, which makes switches with only two states—on and off. In one embodiment of the present invention, a 2 bits per cell storage element is utilized which allows for four states, including a bi-directional state, an unidirectional state in a first direction, an unidirectional state in the opposite direction, and an opened state. In some embodiments, only one unidirectional state and the blocking state are used. In other exemplary embodiments, only one unidirectional state, the bi-directional state and the blocking state are used.

One such 2 bits per cell storage element is implemented using so-called ONO EEPROM device structures based upon semiconductor-oxide-nitride-oxide-semiconductor SONOS cells, in which a charge trapping structure based upon an insulator such as silicon nitride sandwiched between other insulation layers typically silicon dioxide, is used between the gate and channel of the device to establish two bit per cell programmability of the switch.

In the illustrated example, the module 12 comprises configurable logic such as a programmable gate array or other programmable logic device module. The module 13 in this example is a processor module, such as a general-purpose central processing unit for executing software based functions. The module 14 in this example comprises high voltage sources such as charge pumps used for program and erase operations in the non-volatile memory array 11 and for the programmable switches based upon erasable and programmable cells, and for voltage boosting. The long line programmable interconnect structure 15 comprises a plurality of conductors and programmable switches which are used for interconnecting circuit elements which make up the modules 11, 12, 13, 14.

The one transistor programmable switches according to the presentation are used for configuring connections among the circuit elements in the configurable logic module 12, for configuring connections between the long line programmable interconnect 15 and the circuit elements in the modules 11, 12, 13, 14, for configuring connections among the lines in the long line programmable interconnect 15, and for configuring connections directly between the modules independent of the long line programmable interconnect 15. In addition, although not shown in FIG. 1, programmable input/output structures are included on the integrated circuit for driving input and output pins. Such programmable input/output structures may also comprise one transistor programmable switches according to the present invention.

The size and voltage driving capacity of the one transistor programmable switches according to the present invention are selected based upon the function to be achieved. For example, one transistor programmable switches for input/output drivers may have very wide and short channels, or be composed of many such one transistor switches in parallel.

Figure 2A:
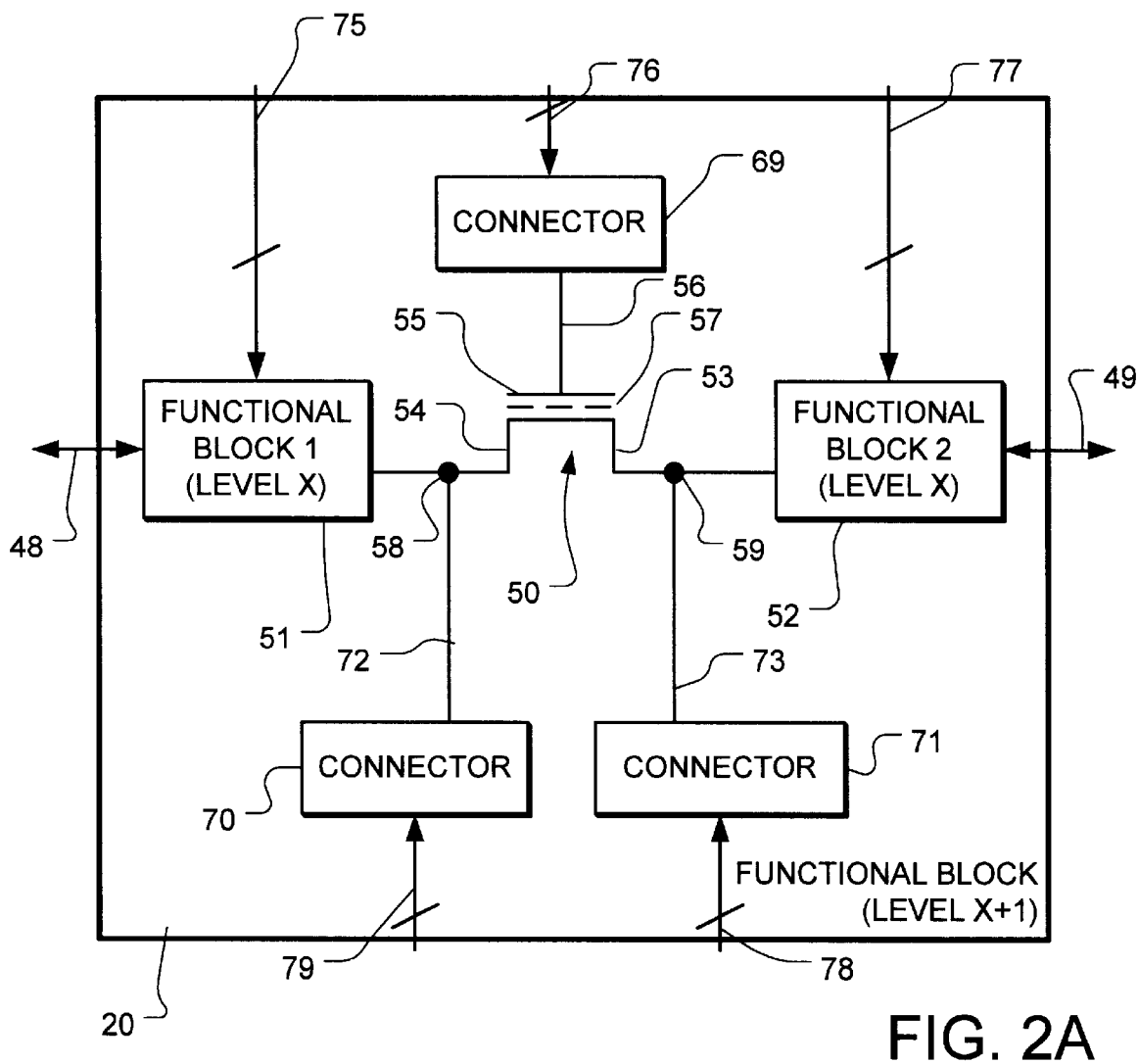
FIGS. 2A and 2B illustrate a charge programmable switch and supporting circuitry in a hierarchical logic circuit, according to one embodiment of the present invention.
Figure 2B:
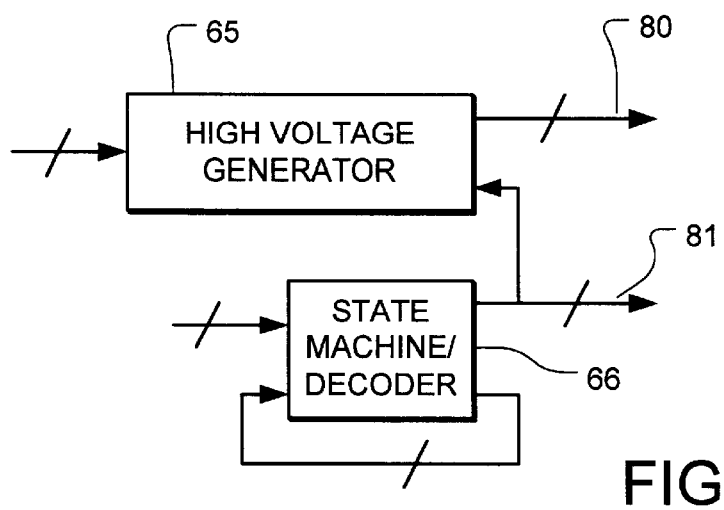

FIGS. 2A and 2B illustrate one implementation of a programmable switch and supporting circuitry according to the present invention. FIG. 2A shows a one transistor programmable switch 50 within a functional block 20 set up to configure connections between circuit elements in a first functional block 51 and circuit elements in a second functional block 52. The switch 50 stores four states, including a first unidirectional state in which the cell allows signal flow in a first direction from node 58 to node 59, as second unidirectional state in which the cell allows signal flow in a second direction, opposite to the first direction, from node 59 to node 58, a third state in which the cell allows bi-directional signal flow between nodes 58 and 59, and a fourth state in which signal flow is blocked (the switch is open).

The first functional block 51 and the second functional block 52 are designated "level X," while the functional block 20 which encloses the level X blocks is designated "level X+1," for example, in a hierarchical design incorporating the switches of the present invention. The level X functional blocks may include the one transistor switches, like switch 50. Also, higher level blocks or lower level blocks with and without switches like switch 50 may be included in the design. The circuit elements in the functional blocks may consist of transistors, diodes, capacitors, conductors and other basic components of integrated circuit designs, as well as other functional blocks. The functional blocks 51, 52 typically comprise many circuit elements interconnected to perform logical functions. In various embodiments, the functional blocks are hard wired logical units, such a central processing units or memory arrays. Another embodiment, functional blocks are configurable logic, such as programmable gate array modules or programmable logic device modules. Arrows 48, 49 suggest interconnection with other circuits or other functional modules.

In this example, the one transistor programmable switch 50 comprises a silicon oxide nitride oxide silicon SONOS transistor having a source 53 and a drain 54. A control gate 55 is coupled to an energizing conductor 56. The data storage element in the SONOS transistor comprises a charge programmable layer of nitride 57. The drain 54 of the transistor 50 is coupled to a first node 58. The source 53 of the transistor 50 is coupled to a second node 59. The first node 58 is coupled to a circuit element in the first functional block 51. The second node 59 is coupled to a circuit element in the second functional block 52.

FIG. 2A illustrates a single programmable switch 50. A large number of programmable switches would be implemented in a typical application of the present invention. Support circuitry for the programmable switch 50 shown in FIG. 2A can be shared among a large number of programmable switches on the device.

The support circuitry includes circuits for programming and erasing the switch and for connecting the components in the various modes of operation. Such support circuitry includes high voltage generator 65, state machine/decoder 66, and controllable connectors 69, 70, 71. The support circuitry also includes the energizing conductor 56, and voltage conductors 72 and 73 which are coupled between connector 70 and node 58 and between connector 71 and node 59, respectively. The control and power lines 75–79 are connected from outside the functional block 20 to the functional blocks 51 and 52, and to the controllable connectors 69, 70 and 71.

FIG. 2B illustrates supporting circuitry for the programmable switch of FIG. 2A which is shared among a plurality of such programmable switches in the integrated circuit and among the various functional blocks. The shared circuitry includes high voltage generator 65 and state machine/decoder 66 supply the power and control signals on lines 80 and 81 to the functional blocks. Thus, lines 80 and 81 supply signals to the lines 75–79 of FIG. 2. The signals include control signals controlling the connectors 69–71, and providing power to the connectors 69–71, in support of charging and discharging the charge storage structure in the programmable switch 50, and in support of operation of the programmable switch during logical operation of the functional blocks.

The energizing voltage applied to the connector 69 for application to the energizing conductor 56, in one embodiment, is boosted using a charge pump for example, to a level at least one threshold voltage higher than the voltage to be transferred across the switch 50, so that voltage dissipation across the switch 50 is minimized or eliminated. Typically, the voltage to be transferred across the switch is the full "rail to rail" our voltage which is applied to the functional blocks 51 and 52. For example, the power voltage on line 75 as applied to the functional block 51 is three volts in one example, the boosted voltage on the energizing conductor 56 in this example is about 4.5 volts. This allows transfer of a signal switching between ground and three volts from node 58 to node 59 without significant loss of power, when the switch 50 is configured to connect nodes 58 and 59.

High voltage generator 65 supplies power for program and erase operations to the node 58 and the node 59 via connectors 70 and 71, and voltage conductors 72 and 73. The state machine/decoder 66 also supplies control signals to the connectors 70 and 71. The control signals supplied are high enough, in one example system, to use as gate voltages on pass transistors used to transfer power onto lines 72 and 73 without significant loss of voltage for efficient operation of the device.

The connectors 69, 70 and 71 are used to support programming and erasing of the switch 50, and for applying the energizing voltage to the control gate 55 of the switch 50 during logical operation of the functional blocks 51, 52.

During logical operation of the functional blocks 51 and 52, the power is applied to the functional blocks 51 and 52. The connectors 70 and 71 are opened, isolating the high voltage generator 66 from the nodes 58 and 59. The connector 69 is closed applying the energizing voltage to the energizing conductor 56.

During logical operation of the functional blocks, if the energizing voltage is higher than the threshold of the SONOS transistor as determined by the charge stored in the nitride layer 57, then the transistor is ON, in one of the two unidirectional states or in the bi-directional state, connecting nodes 58 and 59. If the energizing voltage is less than the threshold of the SONOS transistor as determined by the charge storage in the nitride layer 57, then the transistor is OFF and the switch 50 is opened, disconnecting nodes 58 and 59.

During programming and erasing of the programmable switch 50, the connectors 70 and 71 are used in conjunction with the high voltage generator 66 to control the voltages applied to the nodes 58 and 59. Likewise, the state machine/decoder 66 operates to ensure that the power applied to the circuit elements within the functional blocks 51 and 52 does not interfere with the programming and erasing operations. Likewise the connector 69 is operated to control voltage applied on the node 55 during programming and erasing operations.

Figure 3:
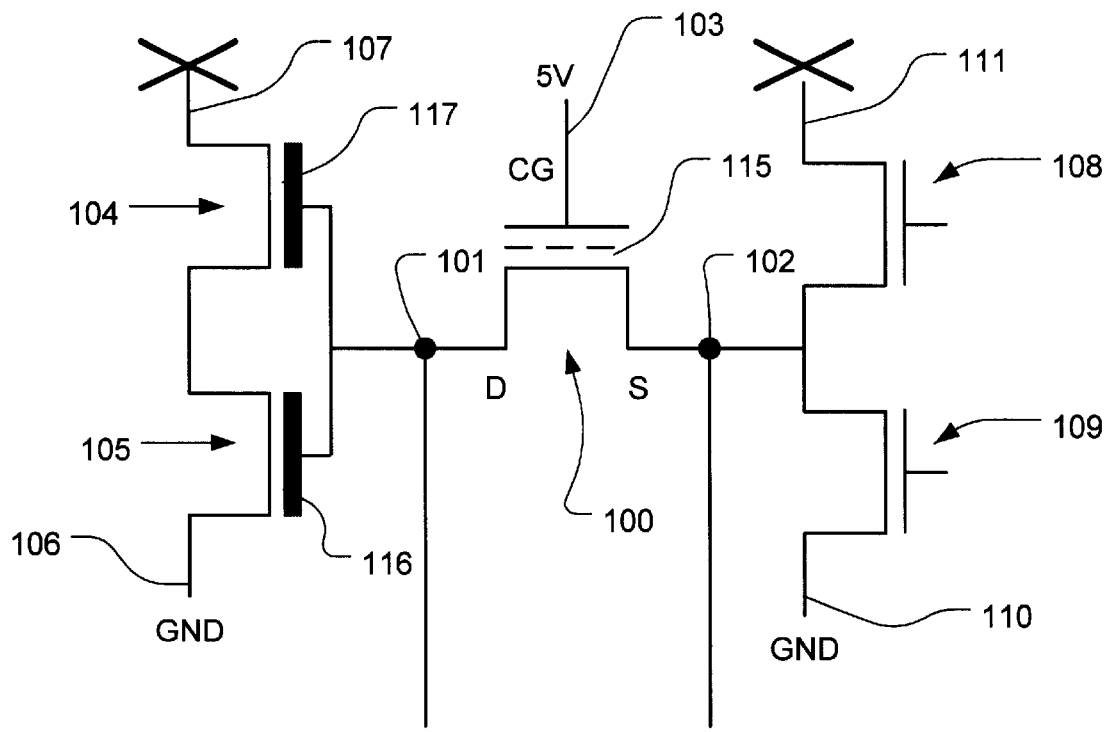
FIGS. 3–4 illustrate connections for programming and erasing a charge programmable switch in one embodiment of the present invention.
Figure 4:
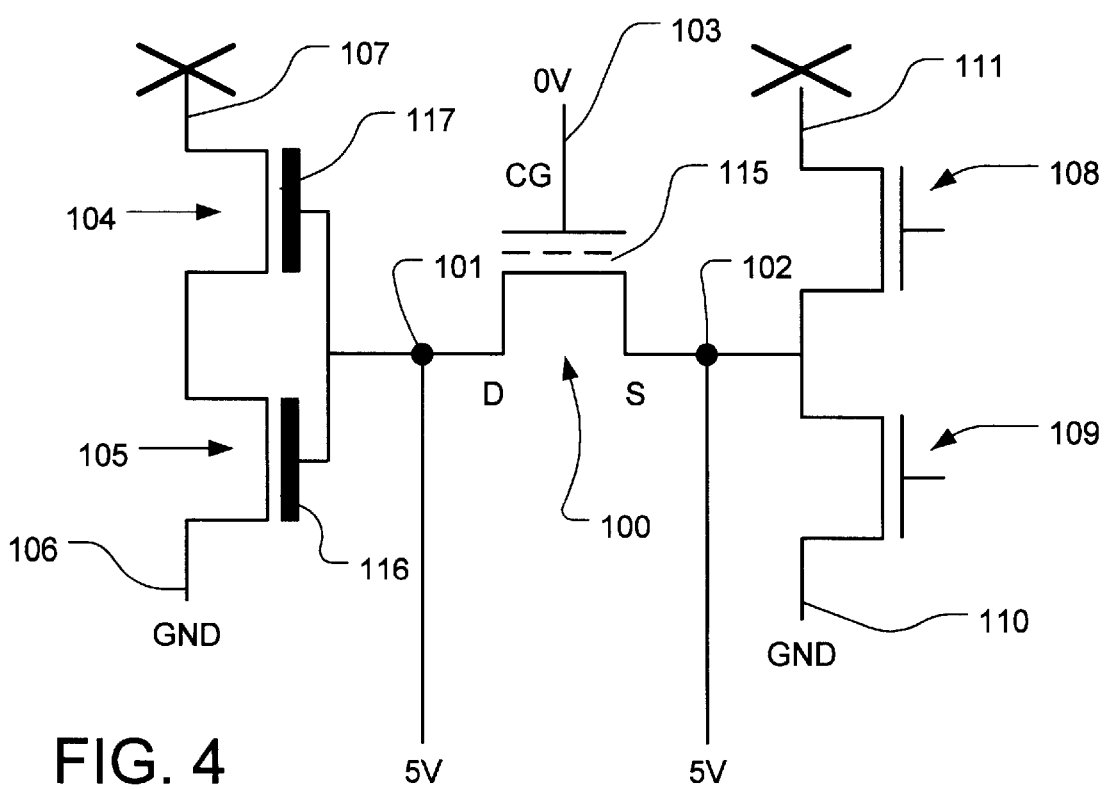

FIGS. 3 and 4 illustrate operation of a SONOS device as a programmable switch according to the present invention for programming and erasing, respectively. In FIG. 3, the SONOS device 100 has a drain coupled to a first node 101, a source to a second node 102, and a control gate coupled to energizing conductor 103. The first node 101 is coupled to circuit elements 104 and 105. The circuit elements 104 and 105 in this example are transistors. The node 101 is coupled to the gates of the transistors. The transistors are coupled between a ground terminal 106 and a power supply terminal 107. The node 102 is coupled to circuit elements 108 and 109. In this example, the circuit elements 108 and 109 are transistors, and the node 102 is coupled to the source of transistor 108 and the drain of transistor 109. The transistors are coupled between a ground terminal 110 and a power supply terminal 111. As illustrated in FIG. 3, during programming, the programming circuitry operates to apply voltages for injecting electrons into the nitride layer 115 of the SONOS device 110, on the source side, on the drain side, or on both sides. In the example shown, electrons are injected on the drain side, by applying 5 volts to the control gate 103 and 5 volts to the drain, while the source is grounded. During the programming operation, the power supply terminal 107 and a power supply terminal 111 are disconnected from the power supply as indicated by the "X's" on the lines, so that power in the circuit elements does not interfere with the programming operation.

A structure is provided on the circuit elements 104 and 105 to enable the circuit elements 104 and 105 to withstand the high voltage on node 101 during the programming operation. In this example, the structure comprises thick gate insulators represented by the thick lines 116 and 117. The thick gate insulators consist essentially of silicon dioxide having thickness sufficient to withstand the high voltage on the node 101. For example, in the conventional transistor which meets the standard design rule for the integrated circuit, the thickness of the silicon dioxide layer used as the gate insulator may be about 100 nanometers. In this example, the thick insulator 116 and thick insulator 117 may be silicon dioxide having thickness of about 200 nanometers. The actual thicknesses of the thick insulators will vary according to the characteristics of the materials well-known in the art in order to withstand be voltages applied during programming and erasing operations. Other structures might be utilized to allow the circuit elements in the functional blocks to withstand the high voltages.

FIG. 4 illustrates the configuration for erasing, or removing electrons from the nitride layer 115. For erasing, the power on terminals 107 and 111 is disconnected. The source and drain receive 5 volts (or more) on nodes 101 and 102, respectively, and the control gate is grounded.

Figure 5:
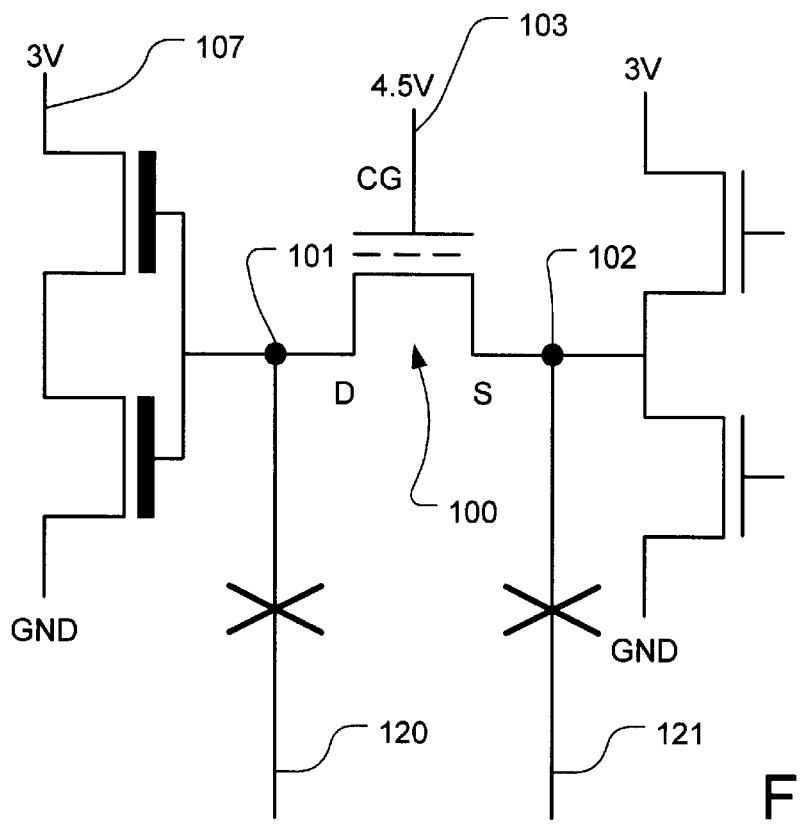
FIGS. 5–6 illustrate connections for operation of the programmable switch during logical operation of integrated circuit, where the switch is programmed on and off respectively.
Figure 6:
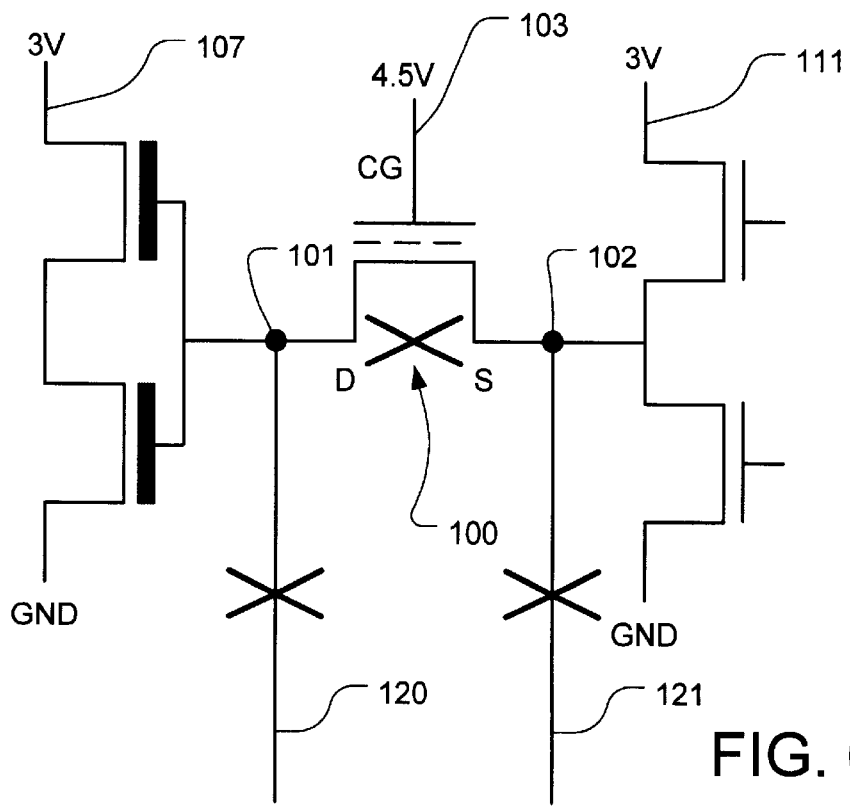

FIGS. 5 and 6 illustrate operation of the device of FIGS. 3 and 4 in the erased, low threshold state (any of the three modes), and the programmed, high threshold state respectively. In FIG. 5, the device 100 is in the low threshold state. During logical operation of the integrated circuit in which the switch 100 is deployed, the voltage conductors 120 and 121 are disconnected from the high voltage circuitry used for programming and erasing. The power is applied on the terminals 107 and 111. The energizing conductor 103 applies energizing voltage to the control gate. Because the threshold of the device 100 is low, the device is in an ON state and the signal is transferred between node 101 and 102, in one of the two unidirectional modes or in the bi-directional mode. The energizing voltage on conductor 103 is set at about 4.5 volts in this example, where the power supply on the circuit elements is about three volts. Thus, the voltage on the conductor 103 is at least one threshold voltage (of the SONOS transistor 100) above the power supply terminal for the circuit elements. Thus, voltage drop across the switch 100 is minimized or eliminated, allowing the switch 100 to support as much as full rail to rail voltage swings.

FIG. 6 illustrate operation when the device 100 is in a high threshold state, or programmed state. In this example, the threshold of the SONOS transistor 100 is greater than the 4.5 volts applied on the energizing conductor 103. Thus, the SONOS transistor 100 is in an OFF state, blocking transfer of signals between node 101 and 102.

A SONOS cell is used as the programmable switch 50 in the structure of FIG. 2. As can be seen, the functional blocks 51 and 52 are connected by the programmable switch 50. Initially, the SONOS programmable device 50 is erased to the state "1 1", which means that the switch is bi-directional and on. To fully isolate the two functional blocks 51, 52, the SONOS programmable device 50 must be programmed to the state "0 0." For uni-directional operation from the source 53 at node 59 to the drain 54 at node 58, the source side of the SONOS device 50 is erased, setting the device 50 into the state "0 1." Tin this unidirectional state, the cell allows uni-directional signal flow by which a high voltage signal on the source 53 will flow to the drain 54, while a high voltage signal on the drain 54 is blocked from flowing to the source 53. For uni-directional operation from the drain 54 at node 58 to the source 53 at node 59, the drain side of the SONOS device 50 is erased, setting the device 50 into the state "1 0." In this unidirectional state, the cell allows uni-directional signal flow by which a high voltage signal on the drain 54 will flow to the source 53, while a high voltage signal on the source 53 is blocked from flowing to the drain 54. The biases used for the program and erase operations for a typical SONOS device 50 are shown in TABLE 1.

TABLE 1

| OPERATION | DRAIN | GATE | SOURCE |
|---|---|---|---|
| PGM "01" | >VCC | >VCC | GND |
| PGM "10" | GND | >VCC | >VCC |
| PGM "00" | FIRST PGM "01" THEN PGM "10" | | |
| ERS "11" | >VCC | <0 V | >VCC |

Figure 7:
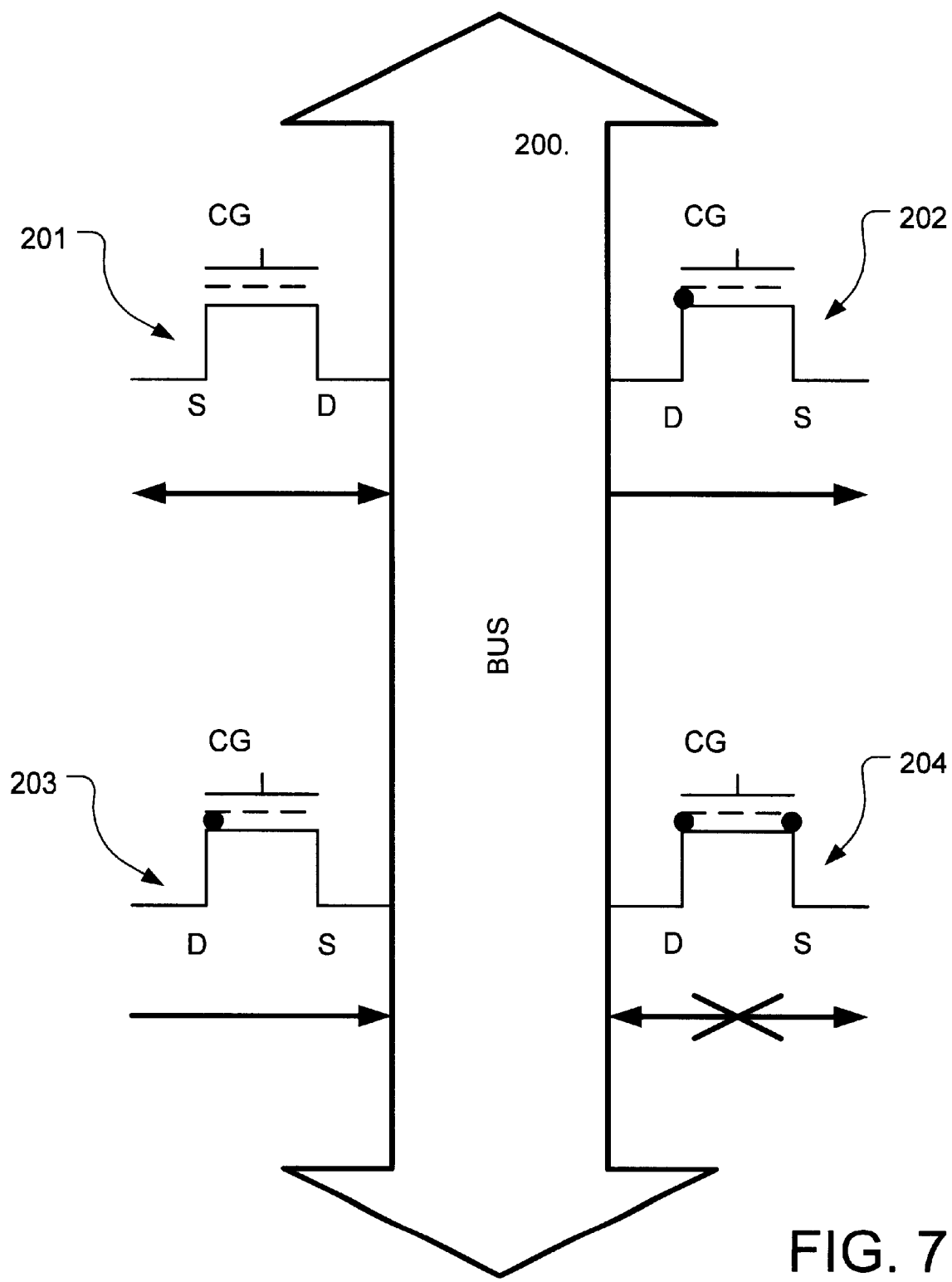
FIG. 7 illustrates implementation of the one transistor, programmable switch for four state, bi-directional operation of bus interconnects, according to one embodiment of the present invention.

Using a non-volatile cell, such as a SONOS cell, as the programmable switch, that has a bi-directional and unidirectional property, a 4-state control switch or interconnect device is provided. FIG. 7 illustrates application of such a SONOS cell in a bus configuration structure. Thus, a bus 200 is shown having a first SONOS cell 201 configured as an ON bi-directional connection, a second SONOS cell 202 configured as in ON unidirectional connection from the bus toward the circuit element, a third SONOS cell 203 configured as an ON uni-directional connection from the circuit element to the bus, and a fourth SONOS cell 204 configured as an OFF connection.

Figure 8:
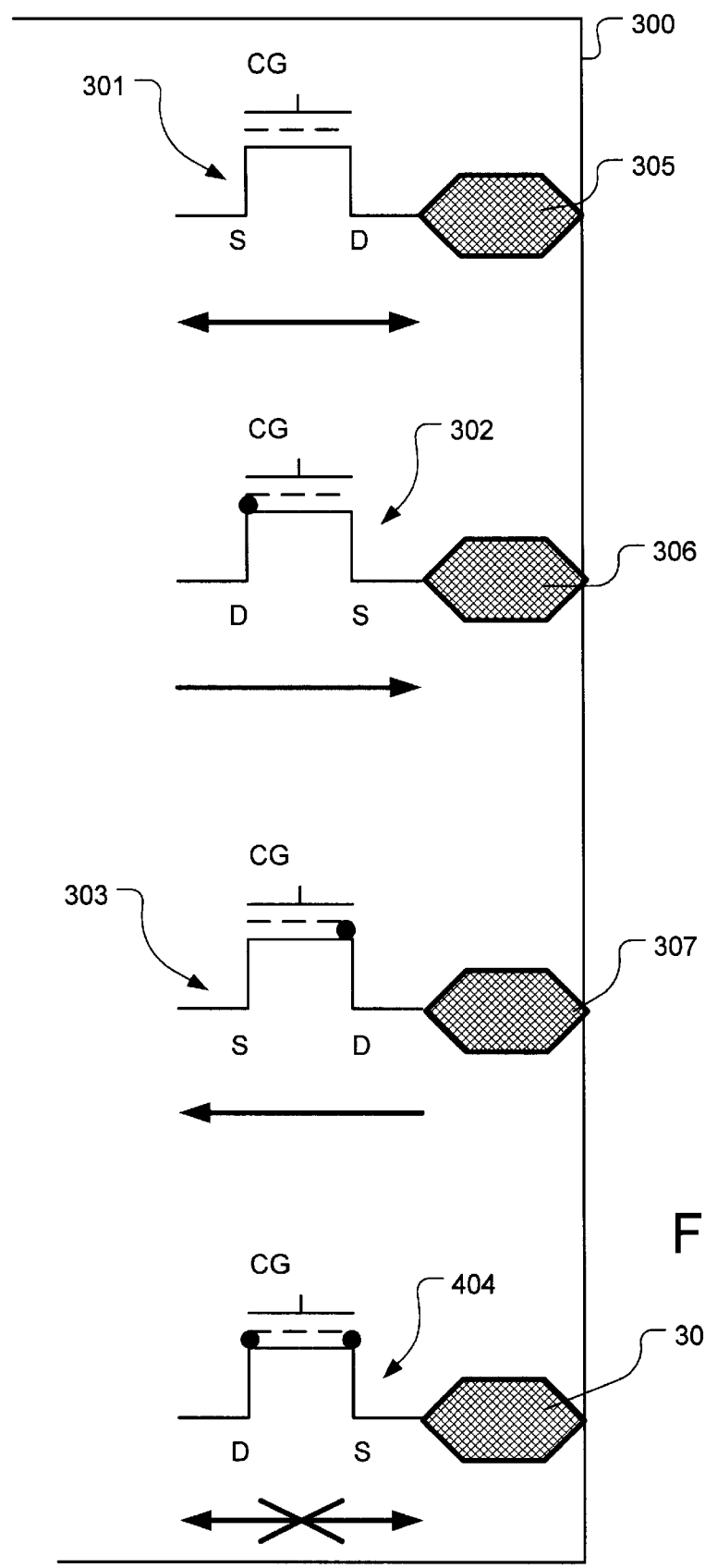
FIG. 8 illustrates implementation of the one transistor, programmable switch for four state, bi-directional operation of input/output drivers, according to one embodiment of the present invention.

FIG. 8 illustrates application of such a SONOS cell in a input/output role for integrated circuit 300. Thus, an integrated circuit 300 is shown having a first SONOS cell 301 configured as an ON bi-directional connection to I/O pin 305, a second SONOS cell 302 configured as in ON uni-directional connection from the circuit to the I/O pin 306, a third SONOS cell 303 configured as an ON uni-directional connection from the I/O pin 307 to the circuit, and a fourth SONOS cell 304 configured as an OFF connection, blocking I/O pin 308. Drivers and electrostatic discharge circuitry (not shown) can be place on either side of the SONOS cell, as suits a particular implementation. Further the SONOS cell can be sized appropriately to handle the currents and voltages required for I/O operation, or multiple SONOS cells may be used in parallel.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A programmable switch for a configurable integrated circuit, comprising:
   a first node and a second node coupled with corresponding circuit elements in the integrated circuit; and
   a non-volatile programmable transistor, having a drain coupled to one of the first node and the second node, a source coupled to the other of the first node and the second node, a gate coupled to an energizing conductor, and a data storage structure, the data storage structure storing at least two states, and the non-volatile transistor operates in a first state allowing uni-directional signal flow from the first node to the second node, and in a second state blocking signal flow, wherein uni-directional signal flow allows a high voltage signal on the first node to flow to the second node, while blocking a high voltage signal on the second node from flowing to the first node.

2. The programmable switch of claim 1, wherein the data storage structure stores more than two states.

3. The programmable switch of claim 1, wherein the data storage structure stores four states, including a third state allowing uni-directional signal flow from the second node to the first node, and a fourth state allowing bi-directional signal flow between the first node and the second node.

4. The programmable switch of claim 1, wherein the data storage structure comprises a nitride layer embedded between insulators.

5. The programmable switch of claim 1, including a charge pump coupled to the energizing conductor, to produce a boosted voltage during logical operation of the integrated circuit.

6. The programmable switch of claim 1, including a charge pump coupled to the energizing conductor, to produce a boosted voltage on said energizing conductor, the boosted voltage greater than the power potential on said circuit elements by at least a threshold voltage of said charge programmable non-volatile device, during logical operation of the integrated circuit.

7. A programmable switch for a configurable integrated circuit, comprising:
  a first node and a second node coupled with corresponding circuit elements in the integrated circuit;
  a non-volatile programmable transistor, having a drain coupled to one of the first node and the second node, a source coupled to the other of the first node and the second node, a gate coupled to an energizing conductor, and a data storage structure, the data storage structure storing at least two states, and the non-volatile transistor operates in a first state allowing uni-directional signal flow from the first node to the second node, and in a second state blocking signal flow, wherein uni-directional signal flow allows a high voltage signal on the first node to flow to the second node, while blocking a high voltage signal on the second node from flowing to the first node; and
  a charge pump coupled to the energizing conductor, to produce a boosted voltage during local operation of the integrated circuit.

8. The programmable switch of claim 7, wherein the data storage structure stores more than two states.

9. The programmable switch of claim 7, wherein the data storage structure stores four states, including a third state allowing uni-directional signal flow from the second node to the first node, and a fourth state allowing bi-directional signal flow between the first node and the second node.

10. The programmable switch of claim 7, wherein the data storage structure comprises a nitride layer embedded between insulators.

11. The programmable switch of claim 7, wherein the boosted voltage is greater than the power potential on said circuit elements by at least a threshold voltage of said non-volatile programmable device, during logical operation of the integrated circuit.

12. A programmable switch for a configurable integrated circuit, comprising:
  a first node and a second node coupled with corresponding circuit elements in the integrated circuit;
  a non-volatile, charge programmable device, having a drain coupled to one of the first node and the second node, a source coupled to the other of the first node and the second node, a gate coupled to an energizing conductor, and a data storage structure, the data storage structure storing at least two states, and the charge programmable device operates in a first state allowing uni-directional signal flow from the first node to the second node, and in a second state blocking signal flow, wherein uni-directional signal flow allows a high voltage signal on the first node to flow to the second node, while blocking a high voltage signal on the second node from flowing to the first node; and
  programming circuitry coupled to the first and second nodes, and to the energizing conductor, to apply voltages sufficient to inject and remove charge from the charge storage structure to program the charge programmable device.

13. The programmable switch of claim 12, wherein the data storage structure stores four states, including a third state allowing uni-directional signal flow from the second node to the first node, and a fourth state allowing bi-directional signal flow between the first node and the second node.

14. The programmable switch of claim 12, wherein the charge storage structure comprises a nitride layer embedded between insulators.

15. The programmable switch of claim 12, wherein the programming circuitry includes a first voltage conductor coupled to the first node and a second voltage conductor coupled to the second node.

16. The programmable switch of claim 12, wherein the circuit element coupled with the first node includes a structure to withstand voltages applied by the programming circuitry.

17. The programmable switch of claim 12, wherein the circuit element coupled with the first node comprises a transistor, having a gate coupled to the first node, and having a gate insulator adapted to withstand voltages applied by the programming circuitry.

18. The programmable switch of claim 12, wherein the circuit element coupled with the first node comprises a transistor, having a gate coupled to the first node, and having a gate insulator comprising essentially a silicon dioxide layer thick enough to withstand voltages applied by the programming circuitry.

19. The programmable switch of claim 12, wherein the programming circuitry includes logic to disconnect power to the circuit element coupled with one of the first and the second nodes while applying energy to remove charge from said charge storage element of said charge programmable device.

20. The programmable switch of claim 12, wherein the programming circuitry includes logic to disconnect power to the circuit element coupled with the first node and to the circuit element coupled with the second node while applying energy to remove charge from said charge storage element of said charge programmable device.

21. The programmable switch of claim 12, wherein the programming circuitry includes logic to disconnect power to the circuit element coupled with one of the first and the second nodes while applying energy to inject charge into said charge storage element of said charge programmable device.

22. The programmable switch of claim 12, wherein the programming circuitry includes logic to disconnect power to the circuit element coupled with the first node and to the circuit element coupled with the second node while applying energy to inject charge into said charge storage element of said charge programmable device.

23. The programmable switch of claim 12, including a charge pump coupled to the energizing conductor, to produce a boosted voltage during logical operation of the integrated circuit.

24. The programmable switch of claim 12, including a charge pump coupled to the energizing conductor, to produce a boosted voltage on said energizing conductor, the boosted voltage greater than the power potential on said circuit elements by at least a threshold voltage of said charge programmable device, during logical operation of the integrated circuit.

25. The programmable switch of claim 12, wherein the programming circuitry includes a first voltage conductor coupled to the first node and a second voltage conductor coupled to the second node, and logic to disconnect said first voltage conductor and said second voltage conductor during logical operation of the integrated circuit.

26. A programmable switch for a configurable integrated circuit, comprising:
a first node and a second node coupled with corresponding circuit elements in the integrated circuit;
a non-volatile, charge programmable device, having a drain coupled to one of the first node and the second node, a source coupled to the other of the first node and the second node, a gate coupled to an energizing conductor, and a data storage structure, the data storage structure storing at least two states, and the charge programmable device operates in a first state allowing uni-directional signal flow from the first node to the second node, and in a second state a second state blocking signal flow; and
programming circuitry coupled to the first and second nodes, and to the energizing conductor, to apply voltages sufficient to inject and remove charge from the charge storage structure to program the charge programmable device, including:
a first voltage conductor coupled to the first node and a second voltage conductor coupled to the second node, and logic to disconnect at least one of said first voltage conductor and said second voltage conductor during logical operation of the integrated circuit;
logic; to disconnect power to the circuit element coupled with one of the first node and the second node while applying energy to at least one of remove and inject charge from said charge storage element of said charge programmable non-volatile device; and
a charge pump coupled to the energizing conductor, to produce a boosted voltage on said energizing conductor, the boosted voltage greater than the power potential on said circuit elements by at least a threshold voltage of said charge programmable non-volatile device, during logical operation of the integrated circuit; and
wherein the circuit element coupled with the first node comprises a transistor, having a gate coupled to the first node, and having a gate insulator adapted to withstand voltages applied by the programming circuitry.

27. The programmable switch of claim 26, wherein the data storage structure stores four states, including a third state allowing uni-directional signal flow from the second node to the first node, and a fourth state allowing bi-directional signal flow between the first node and the second node.

28. The programmable switch of claim 26, wherein the charge storage structure comprises a nitride layer embedded between insulators.

29. The programmable switch of claim 26, wherein said gate insulator comprises essentially a silicon dioxide layer thick enough to withstand voltages applied by the programming circuitry.

30. The programmable switch of claim 26, wherein the programming circuitry comprises resources inducing Fowler-Nordheim tunneling to remove charge from said charge storage element of said charge programmable device.

31. The programmable switch of claim 26, wherein the programming circuitry comprises resources inducing Fowler-Nordheim tunneling to inject charge into said charge storage element of said charge programmable non-volatile device.

32. An integrated circuit comprising:
configurable logic;
a plurality of programmable switches for the configurable logic, at least one of the programmable switches in the plurality of programmable switches comprising:
a first node and a second node coupled with corresponding circuit elements in the integrated circuit;
a non-volatile, charge programmable device, having a drain coupled to one of the first node and the second node, a source coupled to the other of the first node and the second node, a gate coupled to an energizing conductor, and a data storage structure, the data storage structure storing at least two states, and the charge programmable device operates in a first state allowing uni-directional signal flow from the first node to the second node, and in a second state blocking signal flow, wherein mini-directional signal flow allows a high voltage signal on the first node to flow to the second node, while blocking a high voltage signal on the second node from flowing to the first node; and
programming circuitry coupled to the first and second nodes of said at least one programmable switch, and to the energizing conductor, to apply voltages sufficient to inject and remove charge from the charge storage structure to program the charge programmable device.

33. The integrated circuit of claim 32, wherein the data storage structure stores four states, including a third state allowing unidirectional signal flow from the second node to the first node, and a fourth state allowing bi-directional signal flow between the first node and the second node.

34. The integrated circuit of claim 32, wherein the charge storage structure comprises a nitride layer embedded between insulators.

35. The integrated circuit of claim 32, wherein the programming circuitry includes a first voltage conductor coupled to the first node and a second voltage conductor coupled to the second node.

36. The integrated circuit of claim 32, wherein the circuit element coupled with the first node includes a structure to withstand voltages applied by the programming circuitry.

37. The integrated circuit of claim 32, wherein the circuit element coupled with the first node comprises a transistor, having a gate coupled to the first node, and having a gate insulator adapted to withstand voltages applied by the programming circuitry.

38. The integrated circuit of claim 32, wherein the circuit element coupled with the first node comprises a transistor, having a gate coupled to the first node, and having a gate insulator comprising essentially a silicon dioxide layer thick enough to withstand voltages applied by the programming circuitry.

39. The integrated circuit of claim 32, wherein the programming circuitry comprises resources inducing Fowler-Nordheim tunneling to remove charge from said charge storage element of said charge programmable device.

40. The integrated circuit of claim 32, wherein the programming circuitry comprises resources inducing Fowler-Nordheim tunneling to inject charge into said charge storage element of said charge programmable device.

41. The integrated circuit of claim 32, wherein the programming circuitry includes logic to disconnect power to the circuit element coupled with one of the first and the second nodes while applying energy to remove charge from said charge storage element of said charge programmable device.

42. The integrated circuit of claim 32, wherein the programming circuitry includes logic to disconnect power to the circuit element coupled with the first node and to the circuit element coupled with the second node while applying energy to remove charge from said charge storage element of said charge programmable device.

43. The integrated circuit of claim 32, wherein the programming circuitry includes logic to disconnect power to the circuit element coupled with one of the first and the second nodes while applying energy to inject charge into said charge storage element of said charge programmable device.

44. The integrated circuit of claim 32, wherein the programming circuitry includes logic to disconnect power to the circuit element coupled with the first node and to the circuit element coupled with the second node while applying energy to inject charge into said charge storage element of said charge programmable non-volatile device.

45. The integrated circuit of claim 32, including a charge pump coupled to the energizing conductor, to produce a boosted voltage during logical operation of the integrated circuit.

46. The integrated circuit of claim 32, including a charge pump coupled to the energizing conductor, to produce a boosted voltage on said energizing conductor, the boosted voltage greater than the power potential on said circuit elements by at least a threshold voltage of said charge programmable non-volatile device, during logical operation of the integrated circuit.

47. The integrated circuit of claim 32, wherein the programming circuitry includes a first voltage conductor coupled to the first node and a second voltage conductor coupled to the second node, and logic to disconnect said first voltage conductor and said second voltage conductor during logical operation of the integrated circuit.

48. The integrated circuit of claim 32, wherein said configurable logic comprises a hierarchy of functional blocks.

* * * * *